United States Patent [19]
Kim

[11] Patent Number: 5,986,588
[45] Date of Patent: Nov. 16, 1999

[54] BIT STREAM PARSING APPARATUS FOR AUDIO DECODER USING NORMALIZING AND DENORMALIZING BARREL SHIFTERS

[75] Inventor: Hyo-Jin Kim, Seoul, Rep. of Korea

[73] Assignee: LG Electronics, Inc., Seoul, Rep. of Korea

[21] Appl. No.: 08/998,283

[22] Filed: Dec. 24, 1997

[30] Foreign Application Priority Data

Dec. 24, 1996 [KR] Rep. of Korea ............... 96/71309

[51] Int. Cl.⁶ .......................... H03M 7/00; H03M 7/40
[52] U.S. Cl. .................................... 341/60; 341/67
[58] Field of Search .............................. 708/209; 341/60, 341/67, 107, 63; 348/473, 476; 380/46; 396/311

[56] References Cited

U.S. PATENT DOCUMENTS

| | | |
|---|---|---|
| 5,297,207 | 3/1994 | Degele ................................... 380/46 |
| 5,557,271 | 9/1996 | Rim et al. ............................. 341/67 |
| 5,619,200 | 4/1997 | Huang ................................... 341/67 |
| 5,644,310 | 7/1997 | Laczko, Sr. et al. . |
| 5,663,725 | 9/1997 | Jang ..................................... 341/67 |

*Primary Examiner*—Michael Tokar
*Assistant Examiner*—Patrick Wamsley

[57] ABSTRACT

A bit stream parsing apparatus for an audio decoder includes a register unit for storing therein predetermined bits of data stream, a normalizing barrel shifter for shifting the data stream stored in the register unit by a predetermined number of bits, a mask gate unit for masking the number of bits which are to be sampled among the data outputted from the normalizing barrel shifter, and an accumulator for accumulating an output value of the mask gate unit. The apparatus employs a load and parallel shift technique and enables an N-bit stream to be sampled in a single clock cycle, thereby accomplishing a speedy operation.

16 Claims, 3 Drawing Sheets

BIT STREAM PARSING APPARATUS FOR AUDIO DECODER USING NORMALIZING AND DENORMALIZING BARREL SHIFTERS

BACKGROUND OF THE INVENTION

1. Field of the Invention

The present invention relates to a technology for separating a data sample having a desired number of bits therein from a data bit stream which is to be inputted into an audio decoder or a digital signal processor, and more particularly to an improved bit stream parsing apparatus for an audio decoder which makes it possible to employ a load and parallel shift technique in order to separate samples during a single clock cycle.

2. Description of the Background Art

FIG. 1 is a block diagram extracted from U.S. Pat. No. 5,644,310 of "Integrated Audio Decoder System and Method of Operation", wherein portions concerned with the accompanying description of the present invention are data register 114, shift counter 128, load shift counter 130, data shifter 126, accumulator 110, and execution control state machine 104.

Therein, the data shifter 126 provides N-bit data sequentially to the accumulator 110 under the control of the shift counter 128. The accumulator 110 accumulates the N-bit data applied thereto, and the accumulated data are transferred through the multiplexer 124 to the data bus. Also, the shifter counter 128 is controlled by the execution control state machine 104.

The 6-bit load shift counter 130 which is controlled by the execution control state machine 104 checks up how many bits of data are transferred from the data shifter 126 to the accumulator 110. A count value counted by the load shift counter 130 is transferred through the multiplexer 124 to the data bus.

In order to obtain an N-bit data sample from a bit stream, the execution control state machine 104 checks up the state of the load shift counter 130 at each clock cycle and confirms if the count value in the load shift counter 130 is "N".

When a new sample having N-bit data is transferred to the accumulator 110, the count value becomes "N", and at this time the value accumulated in the accumulator 110 becomes transferred through the data bus to a memory.

Therefore, it takes N cycles to obtain an N-bit data sample.

In such a conventional bit stream parsing apparatus, there is employed a load and serial shift technique to process the bit stream and it takes N cycles to obtain an N-bit sample, thereby deteriorating its process rate.

SUMMARY OF THE INVENTION

Accordingly, it is an object of the present invention to provide a bit stream parsing apparatus for an audio decoder which separates an N-bit stream by adopting a load and parallel technique and separates a single sample during one clock cycle.

To achieve the above-described object, there is provided a bit stream parsing apparatus for an audio decoder according to the present invention which includes a register unit for storing therein predetermined bits of data stream, a normalizing barrel shifter for shifting the data stream stored in the register unit by a predetermined number of bits, a mask gate unit for masking the number of bits which are to be sampled among the data outputted from the normalizing barrel shifter, and an accumulator for accumulating an output value of the mask gate unit.

The object and advantages of the present invention will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
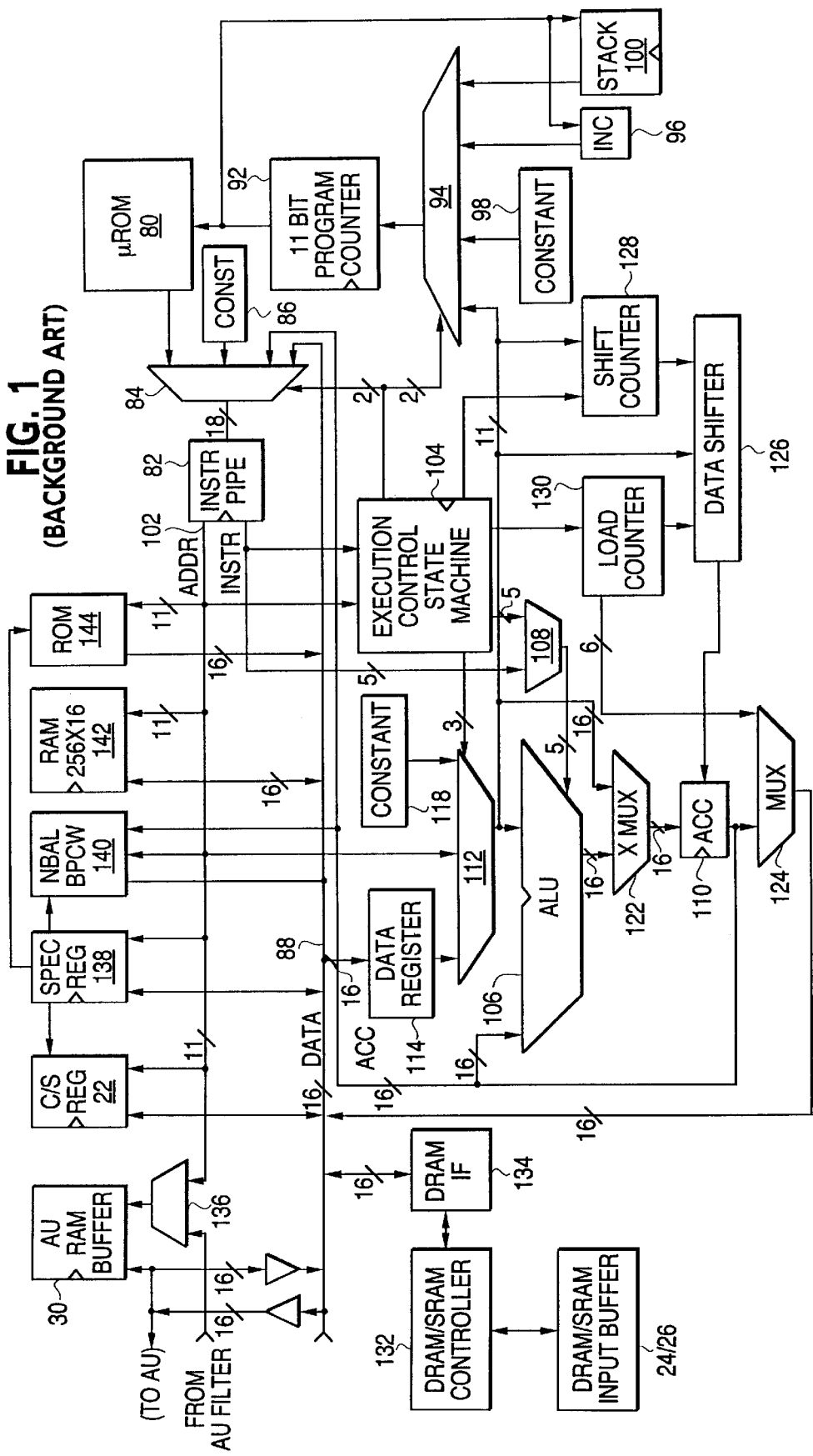
FIG. 1 is a block diagram illustrating a general audio decoder.
Figure 2:
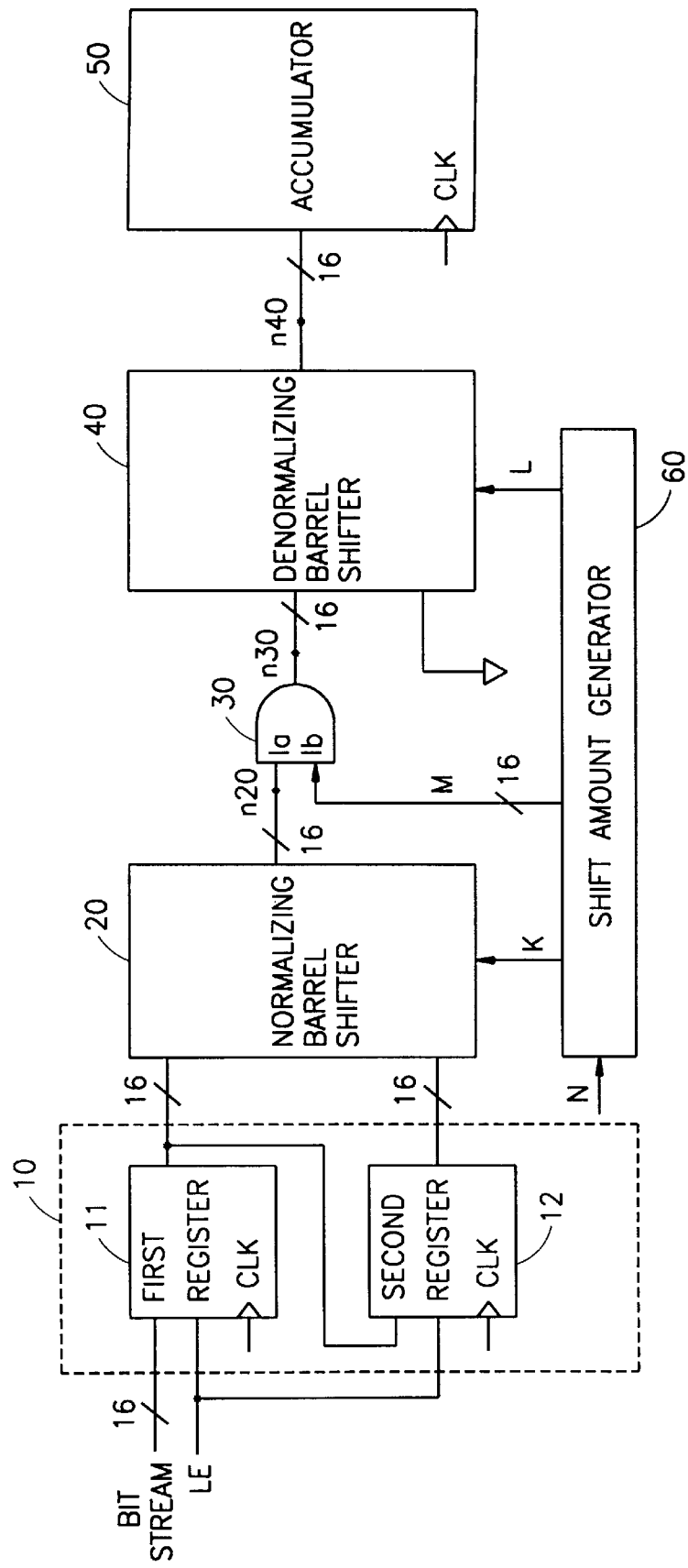
FIG. 2 is a block diagram illustrating a bit stream parsing apparatus for an audio decoder according to a preferred embodiment of the present invention.

FIG. 2 is a block diagram illustrating a bit stream parsing apparatus for an audio decoder according to the present invention.

As shown therein, a register unit 10 converts 16-bit parallel bit streams to a 32-bit bit stream.

A normalizing barrel shifter 20 left-shifts the 16-bit stream received from the register unit 10 in accordance with a first control signal K which indicates a shift amount. Here, the maximal shift amount becomes 16 bits.

A mask gate unit 30 having 16 AND gates (not shown) masks N bits for sampling from the 16-bit data in the normalizing barrel shifter 20 in accordance with a 16-bit second control signal M. Here, when the respective bit values in the second control signal M are "1", the output of the normalizing barrel shifter 20 is outputted unchanged; when the respective bit values in the second control signal M are "0", the output of the normalizing barrel shifter 20 becomes "0".

A denormalizing barrel shifter 40 right-shifts or left-shifts the data masked in accordance with a third control signal L which denotes a shift amount. Here, when the value of the third control signal L is "0", the masked data are outputted unchanged; when the value of the third control signal L is "16−N", the masked data become right-justified.

An accumulator 50 accumulates the output from the denormalizing barrel shifter 40.

A shift amount generator 60 calculates the first control signal K, the second control signal M and the third control signal L according to the bit number N when the bit number N for sampling is designated, thereby outputting the resultant values to respective portions.

The first control signal K is a value which determines the bit number for being shifted, and it is incorporated into ΣN MOD 16. Therein, significant N bits in the 16-bit second control signal M are "1" and the rest thereof become "0".

The register unit 10 includes: a first register 11 for latching the applied 16-bit parallel bit stream BS and outputting the resultant value to the normalizing barrel shifter 20; and a second register 12 for latching the 16-bit parallel bit stream BS which is to be outputted from the first register 11 to the normalizing barrel shifter 20, and outputting the resultant value to the normalizing barrel shifter 20. Here, the first and second registers 11, 12 are enabled by a latch enable signal LE which is a one clock duration pulse that generates a pulse each time when 16 bits are surpassed therein.

The operation of the thusly constituted bit stream parsing apparatus for an audio decoder according to the present invention will now be described.

A new 16-bit data stream is loaded in the first register 11 of the register unit 10 in accordance with the latch enable signal LE, and an old 16-bit data stream previously loaded in the first register 11 becomes loaded into the second register 12. Here, the latch enable signal LE denotes a pulse which is generated each time when the $\Sigma N$ serving as the entire bit stream surpasses "16". Here, N is an externally applied value and denotes the number of bits which are to be sampled in the bit stream.

A 32-bit stream is inputted to the normalizing barrel shifter 20 by the first and second registers 11, 12.

When the number of bits which are to be sampled is determined, the shift amount generator 60 calculates the first control signal K using the bit number N, and the normalizing barrel shifter 20 left-shifts as many bits in the 32-bit stream as designated for the first control signal K. The first control signal K, which is expressed as $\Sigma N$ MOD 16, varies from a minimal 0 to maximal 16. Therefore, the first bit for being sampled becomes MSB.

The mask gate 30 masks the data outputted from the normalizing barrel shifter 20 in accordance with the second control signal M which is outputted from the shift amount generator 60, and although only one AND gate is shown in FIG. 2, it is practically formed of 16 AND gates. The 16-bit data which are left-shifted in the normalizing barrel shifter 20 are applied to respective input terminals I$a$ of the AND gates, and the second control signal M is applied to each of the other respective input terminals I$b$ of the AND gates.

The significant N bits in the second control signal M are "1", and the rest thereof are "0". Accordingly, when the data outputted from the normalizing barrel shifter 20 pass through the mask gate 30, the significant N bits maintain their original values, the rest of the bits are outputted as "0". In other words, the bits for being sampled among the shifted data bits in the normalizing barrel shifter 20 maintain their original values, the rest thereof are outputted as "0".

A denormalizing barrel shifter 40 right-shifts or left-shifts the data outputted from the mask gate 30. Here, the amount of bits for being right-shifted is determined by the third control signal L. If a left-justifying method is adopted, the third control signal L is provided as "0", and at this time the data outputted from the mask gate 30 are not shifted but outputted to the accumulator 50. That is, because the data are already left-aligned in the normalizing barrel shifter 20, the MSB for the N-bit sample becomes MSB in the accumulator 50.

To the contrary, in a right-justifying method, the third control signal L is provided in "16−N", and accordingly the data outputted from the mask gate 30 become right-aligned and then outputted to the accumulator 50, whereby the LSB for the N-bit sample becomes LSB in the accumulator.

Whether the denormalizing barrel shifter 40 makes a left shifting or a right shifting with regard to the data is determined by how (using what method) the accumulator 50 carries out its accumulation. For example, when the sample in the accumulator 50 should be right-shifted, the denormalizing barrel shifter 40 makes a right shifting of the sample, and when the sample in the accumulator 50 should be left-shifted, because the sample in the normalizing barrel shifter 20 is already left-aligned, the denormalizing barrel shifter 40 passes the sample being inputted thereto.

As a result, only a single clock cycle is required during a time period when the bit stream BS loaded in the register unit 10 is applied through the normalizing barrel shifter 20, the mask gate 30, and the denormalizing barrel shifter 40 to the accumulator 50.

Figure 3:
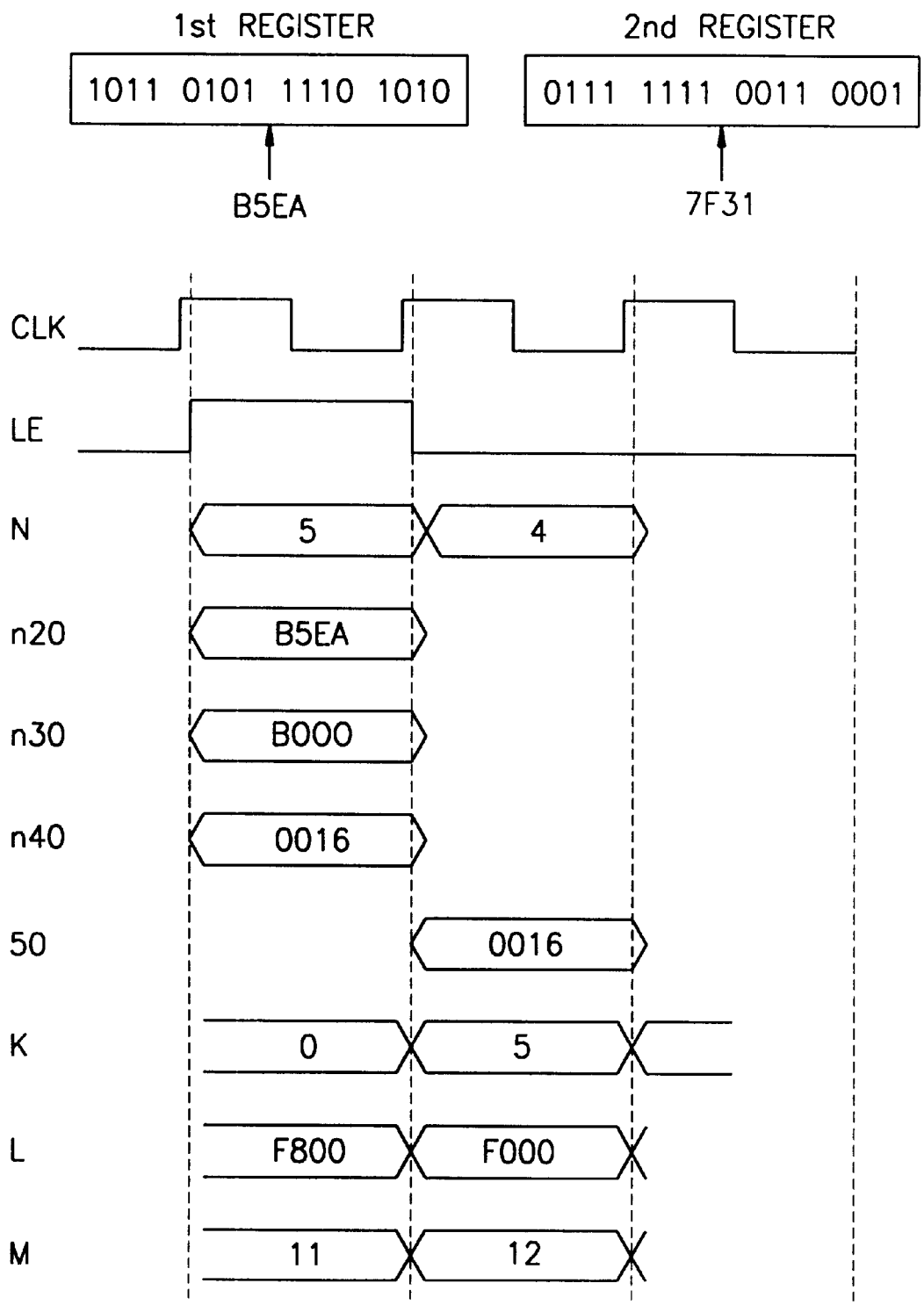
FIG. 3 is a composite view detailing data shifting with regard to respective portions in FIG. 2.

With reference to FIG. 3, the detailed operation of the bit stream parsing apparatus for an audio decoder according to the present invention will now be described.

Assuming that 16-bits of the bit stream loaded in the first register 11 of the register unit 10 is "B5EA", that 16-bits of the bit stream loaded in the second register 12 of the register unit 10 is "7F31", that the number of bits being sampled is "N" which is varied to "5" at first and "4" at second, and that the denormalizing barrel shifter 40 makes a right shifting with regard to data, the operation of the present invention will be as follows.

First, there will be explained a case in which the number N of sampled bits is "5".

Here, the shift amount generator 60 assigns the first control signal K as "0", the second control signal M as "F800" in hexadecimal, and the third control signal L as 16−N=11 in bit number.

The value of a 32-bit stream applied to the normalizing barrel shifter 20 becomes "B5EA 7F31" which is to be shifted to the left by as many bits as in the first control signal L. Meanwhile, because the value of the first control signal K is "0", the significant 16 bits "B5EA" of the 32-bit stream "B5EA 7F31" is not modified, and it is outputted through an output node n20 to the respective input terminals I$a$ of the respective AND gates in the mask gate unit 30. Here, the value "B5EA" is "1011 0101 1110 1010" in binary digits, and the second control signal M applied to the other input terminals I$b$ in the mask gate unit 30 becomes "1111 1000 0000 0000" in binary digits.

The respective bits in the two data values are ANDed in the 16 AND gates in the mask gate unit 30, so that the data value outputted via an output node n30 of the mask gate unit 30 becomes "1011 0000 0000 0000" which is expressed as "B000" in hexadecimal as shown in FIG. 3.

The denormalizing barrel shifter 40 right-shifts the data value "B000" by 11 bits in accordance with the third control signal L. Accordingly, the data value applied to the accumulator 50 via an output node n40 becomes "0000 0000 0001 0110" which is expressed as "0016" in hexadecimal.

Likewise, the parsing operation is completed in a single cycle period of clock signal CLK, and the data value inputted into the accumulator 50 in the next cycle of the clock signal CLK is "0016".

Next, there will be explained another case in which the number N of sampled bits is "4".

Here, the first control signal K becomes "5". The value of the significant 4 bits in the second control signal M becomes "1", and the rest of the 12 bits thereof becomes "0". The third control signal L becomes 16−N=12 in bit number.

The normalizing barrel shifter 20 shifts the bit stream value "B5EA 7F31" by K bits, that is, by 5 bits to the left. Therefore, 5 bits of the data inputted into the normalizing barrel shifter 20 are left-shifted, thereby being inputted into the mask gate unit 30. The respective operations of the mask gate unit 30 and the denormalizing barrel shifter 40 will be omitted as they are similar to those of the bit number 5 in sampled bits.

Meanwhile, when the ΣN surpasses "16", the latch enable LE is generated. Accordingly, a new 16-bit stream is inputted into the first register 11, and an old 16-bit stream previously stored in the first register 11 is inputted into the second register 12.

As described above, the bit stream parsing apparatus for an audio decoder according to the present invention employs a load and parallel shift technique and enables an N-bit stream to be sampled in a single clock cycle, thereby accomplishing a speedy operation.

Further, the bit stream parsing apparatus for an audio decoder according to the present invention realizes a composite function including a left/right alignment by the barrel shifter, thereby predicting an entire parsing cycle.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within metes and bounds of the claims, or equivalences of such metes and bounds are therefore intended to embrace the appended claims.

What is claimed is:

1. A bit stream parsing apparatus for an audio decoder, comprising:

a register unit for storing therein predetermined bits of a data stream;

a normalizing barrel shifter for shifting the data stream stored in the register unit by a predetermined number of bits;

a mask gate unit for masking a number of bits which are to be sampled among data output from the normalizing barrel shifter to provide a parsed output; and an accumulator for accumulating the parsed output of the mask gate unit.

2. The bit stream parsing apparatus of claim 1, further comprising a shift amount generator for outputting the predetermined number of bits which are to be shifted by the normalizing barrel shifter to the normalizing barrel shifter, and outputting the number of bits which are to be sampled to the mask gate unit.

3. The bit stream parsing apparatus of claim 2, wherein the mask gate unit includes a plurality of AND gates, each having an input terminal to which is applied respective bits of sample data output from the normalizing barrel shifter and another input terminal to which is applied respective bits of a control signal output from the shift amount generator, predetermined bits of the control signal which correspond to bits which are to be sampled by the mask gate unit are respectively "1" and other bits of the control signal are respectively "0".

4. The bit stream parsing apparatus of claim 1, further comprising a denormalizing barrel shifter for left-shifting or right-shifting the parsed output of the mask gate unit and outputting a resultant value to the accumulator.

5. The bit stream parsing apparatus of claim 4, further comprising a shift amount generator for outputting a number of bits to be left-shifted or right-shifted to the denormalizing barrel shifter.

6. The bit stream parsing apparatus of claim 1, wherein the register unit comprises:

a first register for loading in parallel therein the predetermined bits of the data stream and outputting the loaded bits to the normalizing barrel shifter; and a second register for loading therein the predetermined bits of the data stream output from the first register and outputting the loaded bits to the normalizing barrel shifter.

7. The bit stream parsing apparatus of claim 1, wherein the normalizing barrel shifter left-shifts data stored therein.

8. The bit stream parsing apparatus of claim 1, wherein a parsed output is provided from the mask gate unit as a parsed sample of the data stream stored in the register unit in a single clock period.

9. A bit stream parsing method comprising the steps of:

a) storing predetermined bits of a data stream;

b) normalizing the data stream by shifting the data stream stored in said step a) by a predetermined number of bits;

c) masking a number of bits which are to be sampled among the data stream shifted in said step b) to provide a parsed output; and d) accumulating the parsed output of said step c).

10. The bit stream parsing method of claim 9, further comprising the steps of:

e) designating the predetermined number of bits which are to be shifted in said step b); and f) designating the number of bits which are to be sampled in said step c).

11. The bit stream parsing method of claim 10, wherein said step c) comprises ANDing respective bits of the data stream shifted in said step b) with respective bits of a control signal, respective bits of the control signal corresponding to the predetermined bits which are designated to be sampled in said step e) are respectively "1" and other bits of the control signal are respectively "0".

12. The bit stream parsing method of claim 9, further comprising the step of e) denormalizing the parsed output of said step c) by left-shifting or right-shifting the parsed output, the denormalized data stream being provided for accumulating in said step d).

13. The bit stream parsing method of claim 12, further comprising the step of f) designating a number of bits to be left-shifted or right-shifted in said step e).

14. The bit stream parsing method of claim 9, wherein said step a) comprises:

a1) loading the predetermined bits of the data stream in parallel into a first register; and a2) loading the predetermined bits of the data stream loaded in the first register in parallel into a second register.

15. The bit stream parsing method of claim 9, wherein said step b) comprises left-shifting the data stream.

16. The bit stream parsing method of claim 9, wherein the parsed output of said step c) is provided as a parsed sample of the data stream stored in said step a) in a single clock period.

* * * * *